United States Patent
Salman et al.

(10) Patent No.: US 9,633,990 B2
(45) Date of Patent: Apr. 25, 2017

(54) BI-DIRECTIONAL ESD PROTECTION DEVICE

(71) Applicant: Texas Instruments Incorporated, Dallas, TX (US)

(72) Inventors: Akram A. Salman, Plano, TX (US); Farzan Farbiz, Dallas, TX (US); Aravind C. Appaswamy, Dallas, TX (US); Ann Margaret Concannon, Palo Alto, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/188,235

(22) Filed: Jun. 21, 2016

(65) Prior Publication Data
US 2016/0300831 A1    Oct. 13, 2016

Related U.S. Application Data

(62) Division of application No. 14/578,747, filed on Dec. 22, 2014, now Pat. No. 9,397,085.

(60) Provisional application No. 61/921,493, filed on Dec. 29, 2013.

(51) Int. Cl.
| | |
|---|---|
| H01L 21/8238 | (2006.01) |
| H01L 21/8222 | (2006.01) |
| H01L 23/62 | (2006.01) |
| H01L 27/02 | (2006.01) |
| H01L 27/06 | (2006.01) |
| H01L 29/66 | (2006.01) |
| H01L 21/265 | (2006.01) |
| H01L 29/747 | (2006.01) |

(52) U.S. Cl.
CPC ........ *H01L 27/0259* (2013.01); *H01L 21/265* (2013.01); *H01L 21/8222* (2013.01); *H01L 27/0623* (2013.01); *H01L 29/6625* (2013.01); *H01L 29/66386* (2013.01); *H01L 29/747* (2013.01)

(58) Field of Classification Search
CPC ............ H01L 27/0259; H01L 27/0623; H01L 21/265; H01L 21/8222; H01L 29/6625; H01L 29/66386; H01L 29/747
USPC ............... 438/133, 199, 237, 297, 309, 328; 257/133, 355, 362, 370, 526, 575, 257/E21.37, E21.642, E21.644, E27.016, 257/E27.052, E29.181
See application file for complete search history.

(56) References Cited

U.S. PATENT DOCUMENTS

| | | | |
|---|---|---|---|
| 6,049,119 A | 4/2000 | Smith | |
| 6,399,990 B1* | 6/2002 | Brennan | H01L 27/0266 257/355 |
| 7,244,992 B2* | 7/2007 | Ker | H01L 27/0266 257/355 |
| 8,597,993 B2* | 12/2013 | Chang | H01L 27/0277 257/E21.352 |
| 8,680,620 B2* | 3/2014 | Salcedo | H01L 27/0921 257/355 |

(Continued)

*Primary Examiner* — Dao H Nguyen
(74) *Attorney, Agent, or Firm* — Jacqueline J. Garner; Charles A. Brill; Frank D. Cimino

(57) ABSTRACT

An integrated circuit and method with a bidirectional ESD transistor. A base diffusion separates an emitter diffusion and a collector diffusion. Silicide is blocked from the base diffusion, the emitter-base junction, the collector-base junction, and from equal portions of the emitter diffusion and the collector diffusions.

8 Claims, 17 Drawing Sheets

(56) References Cited

U.S. PATENT DOCUMENTS

| | | | |
|---|---|---|---|
| 2001/0016380 A1* | 8/2001 | Watanabe | H01L 27/0251 438/237 |
| 2005/0045956 A1* | 3/2005 | Chen | H01L 27/0266 257/355 |
| 2006/0170054 A1 | 8/2006 | Mergens et al. | |
| 2013/0146978 A1* | 6/2013 | Mahalingam | H01L 27/0274 257/355 |
| 2013/0285113 A1 | 10/2013 | Edwards et al. | |
| 2013/0330884 A1* | 12/2013 | Salcedo | H01L 27/0262 438/133 |
| 2014/0131710 A1 | 5/2014 | Chung | |

* cited by examiner

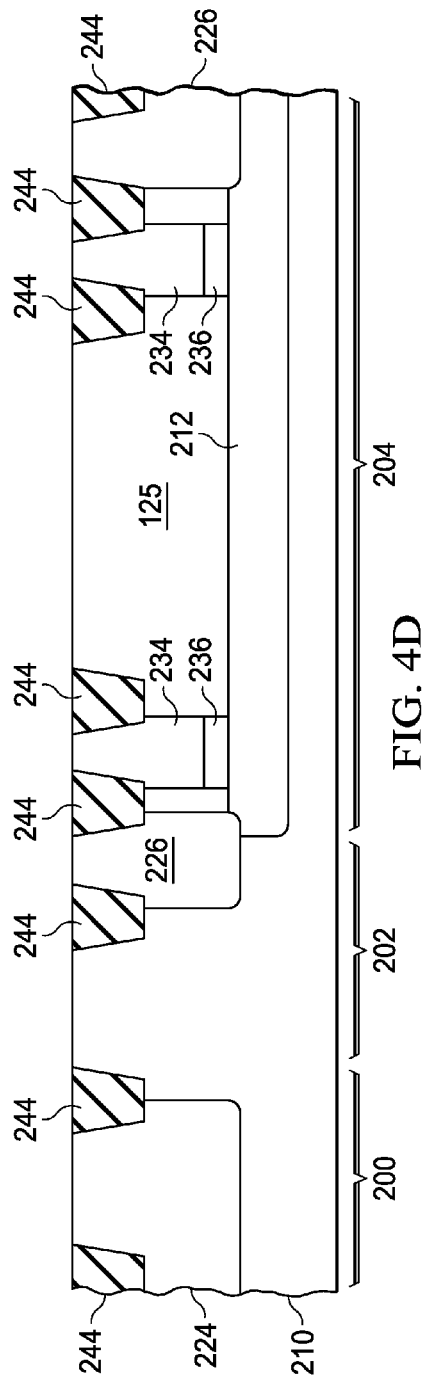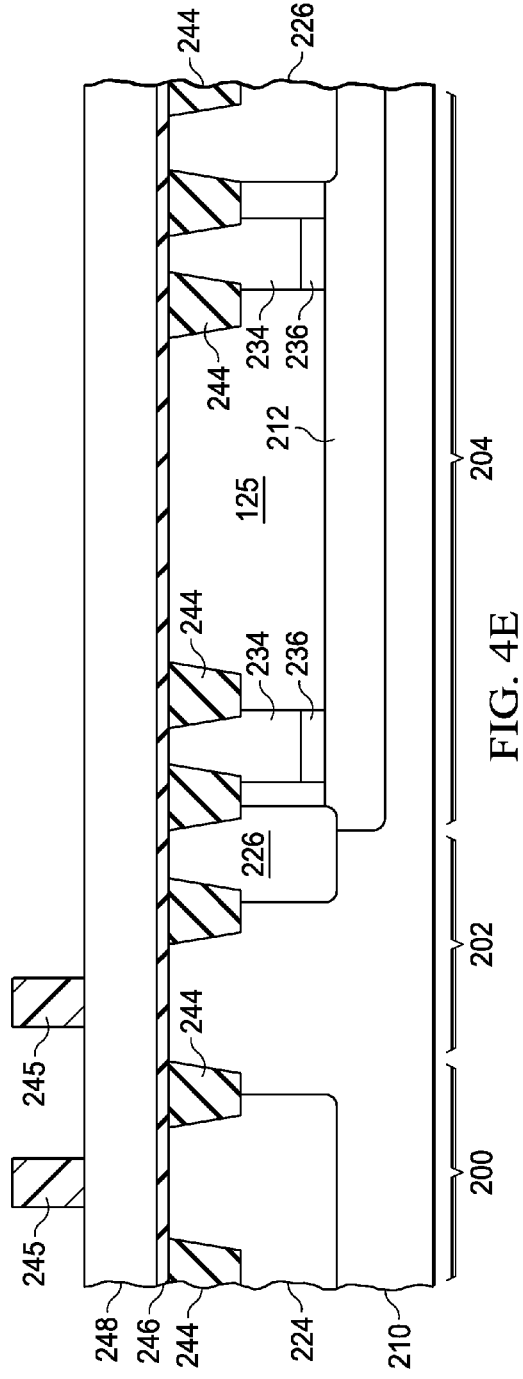

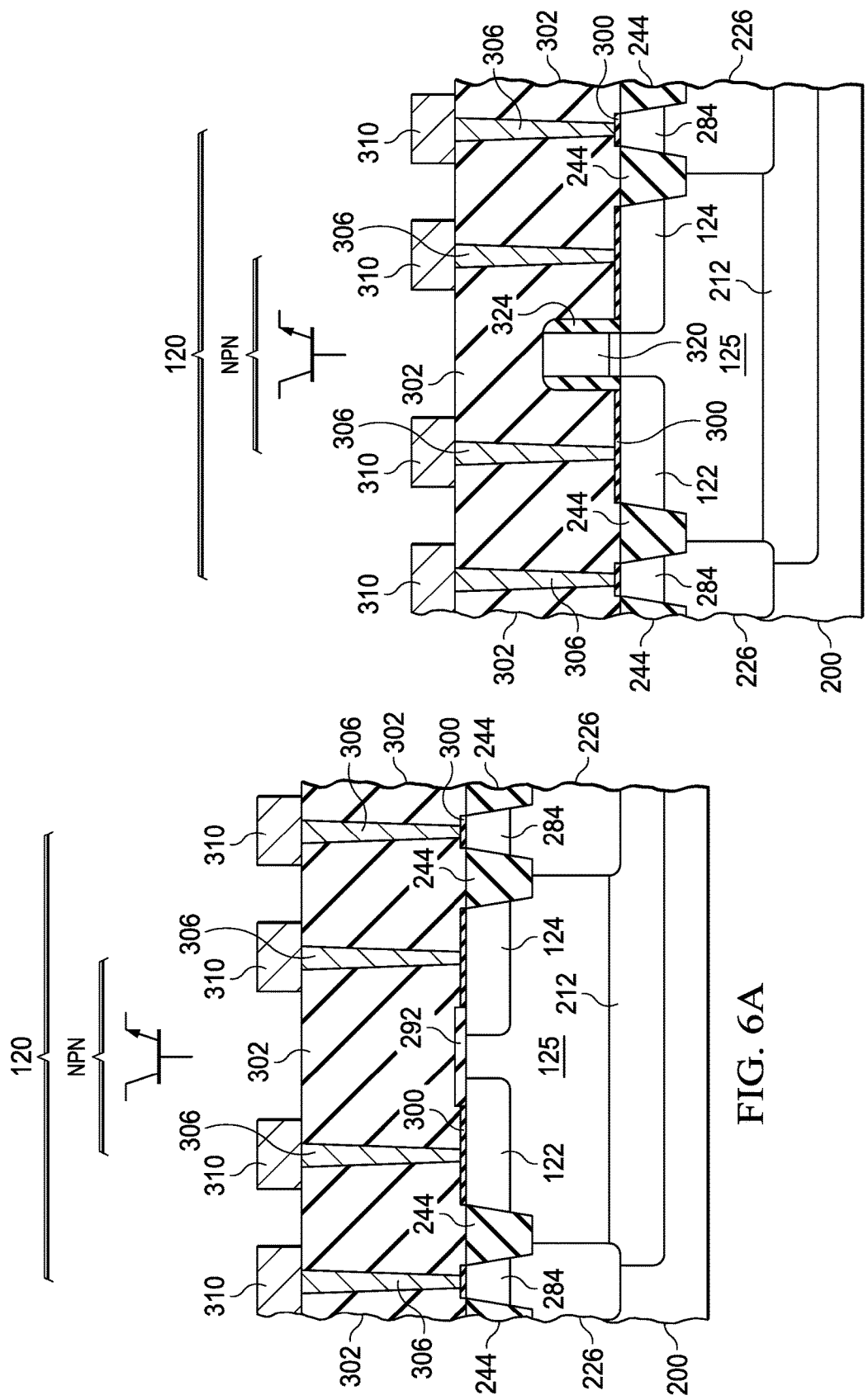

BI-DIRECTIONAL ESD PROTECTION DEVICE

CROSS-REFERENCE TO RELATED APPLICATIONS

This application is a divisional of U.S. Nonprovisional patent application Ser. No. 14/578,747, filed Dec. 22, 2014, which claims the benefit of U.S. provisional application Ser. No. 61/921,493, filed Dec. 29, 2013, the contents of both of which are herein incorporated by reference in its entirety.

FIELD OF INVENTION

This invention relates to the field of integrated circuits. More particularly, this invention relates to electrostatic protection circuits for integrated circuits.

BACKGROUND

Electrostatic discharge (ESD) is a continuing problem in the design, manufacture, and utilization of integrated circuits (ICs). A major source of ESD exposure to ICs is from the human body (described by the "Human Body Model", HBM). In this situation, a packaged IC acquires a charge when it is touched by a human who is electrostatically charged (e.g. from walking across a carpet). A charge of about 0.4 uC may be induced on a body capacitance of 100 pF, for example, leading to an electrostatic potential of 4 kV or more and discharge peak currents of several amperes to the IC for longer than 100 ns. A second source of ESD exposure is from charged metallic objects (described by the "Machine Model", MM), which is characterized by a greater capacitance, lower internal resistance and transients that have significantly higher peak current levels than a HBM ESD source. A third source of ESD exposure is due to the discharge of stored charge on the integrated circuit itself (described by the "Charged Device Model", CDM), to ground with rise times of less than 500 ps. The current flow during CDM is in the opposite direction of the HBM and MM ESD sources. For all three sources of ESD exposure, both positive and negative polarity discharges may occur.

Electrostatic discharge transistors may be formed on an integrated circuit chip to protect the input and output (I/O) pins of the integrated circuit or electrostatic discharge transistor circuits may be manufactured and packaged as stand-alone devices. The standalone ESD circuit may be placed on an integrated circuit board to protect board components from ESD events.

A circuit diagram of a conventional ESD circuit is shown in FIG. 1A. It consists of two NPN transistors, 102 and 106, with their emitters and bases coupled together. The emitter of each NPN transistor is coupled to a terminal through a forward biased diode. The emitter of NPN transistor 102 is coupled to Vss through diode 104 and the emitter of NPN transistor 106 is coupled to a pin (IN) through diode 100. When a negative ESD pulse hits IN, NPN ESD transistor 106 turns on and current is discharged from IN in series through forward biased diode 100 and NPN transistor 106. When a positive ESD pulse hits IN, NPN ESD transistor 102 turns on and current is discharged from IN in series through forward biased diode 104 and NPN ESD transistor 102.

The clamp voltage of the conventional ESD circuit in FIGS. 1A and 1B is the clamp voltage of the NPN ESD transistor plus the clamp voltage of the diode which is in series ($V_{clamp\_NPN} V_{clamp\_diode}$). Series diodes 100 and 104 must be sufficiently large to handle the largest ESD strikes that may occur. If the diodes, 100 and 104, are not sufficiently large, the forward biased diode voltage may rise above what is safe for the integrated circuit due to current crowding and destroy the integrated circuit.

As shown in the top down layout of the integrated circuit in FIG. 1B, the conventional ESD transistor circuit in FIG. 1A may consume considerable silicon area. The first NPN ESD transistor 102 consists of an n-type emitter diffusion 112 and an n-type collector diffusion 114 separated by a strip of p-type base. Silicide may be blocked from a portion of the collector diode 114 as is indicated by dashed region 115. The second NPN ESD transistor 106 consists of an n-type emitter diffusion 116 and an n-type collector diffusion 118 separated by a strip of p-type base. Silicide may be blocked from a portion of the collector diode 118 as is indicated by dashed region 115. P-type diffusions form substrate contacts, 108 and 110, to the base of the NPN ESD transistors 102 and 106. P/N diodes 100 and 104 are formed of multiple alternating n-type diode diffusions 117 in an isolated pwell and isolated pwell contacts 119. The diodes 100 and 104 are formed in isolated pwells which are separate from the isolated pwells in which the NPN transistors 102 and 106 are formed.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A bidirectional ESD transistor and method for forming in an integrated circuit. A base diffusion separates an emitter diffusion and a collector diffusion. Silicide is blocked from the base diffusion, the emitter-base junction, the collector-base junction, and from equal portions of the emitter diffusion and the collector diffusions.

BRIEF DESCRIPTION OF THE DRAWINGS

FIGS. 4A-4K are illustrations of steps in the fabrication of integrated circuits formed according to principles of the invention.

FIG. 6A-6C are cross sectional views of an embodiment ESD circuit protection devices formed according to the principles of the invention.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 2A:
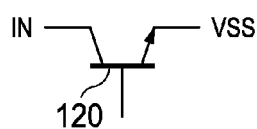
FIGS. 2A and 2B are a circuit diagram and a layout of an embodiment ESD circuit protection device formed according to principles of the invention.
Figure 2B:
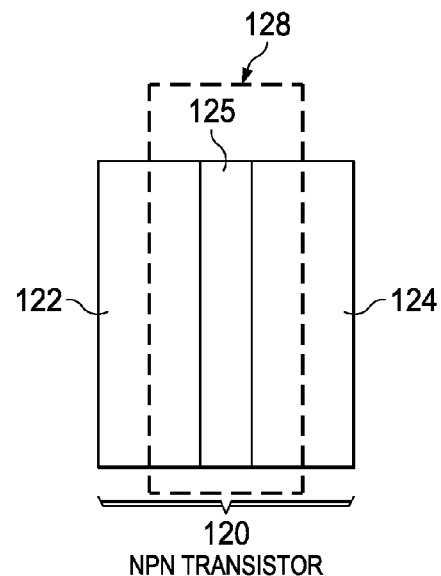

The circuit diagram and layout of a first embodiment bidirectional ESD circuit with improved performance and reduced area is illustrated in FIGS. 2A and 2B.

An embodiment base floating bidirectional ESD bipolar transistor 120 circuit diagram is shown in FIG. 2A. A top down view of a layout of the embodiment bidirectional ESD bipolar transistor 120 is shown in FIG. 2B. The embodiment bidirectional ESD bipolar transistor 120 is illustrated in FIG. 2A with the emitter coupled to the IN pin and the collector coupled to the Vss pin but since the embodiment ESD bipolar transistor 120 is bidirectional it may also be drawn with the collector coupled to the IN pin and the emitter coupled to the Vss pin.

As is illustrated in the plan view in FIG. 2B, the embodiment base floating bidirectional ESD bipolar transistor 120 consists of two symmetrical N+ diffusions, 122 and 124, separated by lightly doped p-type base region 125. Silicide is blocked 128 from the base region 125, is blocked from the pn-junctions formed between the base 125 and the emitter diffusions, 122 and 124, and is blocked from a portion of the emitter diffusions 122 and 124.

The silicide is blocked to prevent the N+ emitter (122 or 124) and N+ collector (122 or 124) diffusions from shorting to the p-type base 125. Another advantage of blocking silicide from a portion of the N+ emitter and collector, 122 and 124 diffusions is that it adds series resistance to the ESD circuit. The series resistance improves current uniformity during high current ESD events. The amount of series resistance that is added may be varied by adjusting the area where silicidation is blocked from the N+ emitter and collector, 122 and 124 diffusions.

Figure 6C:
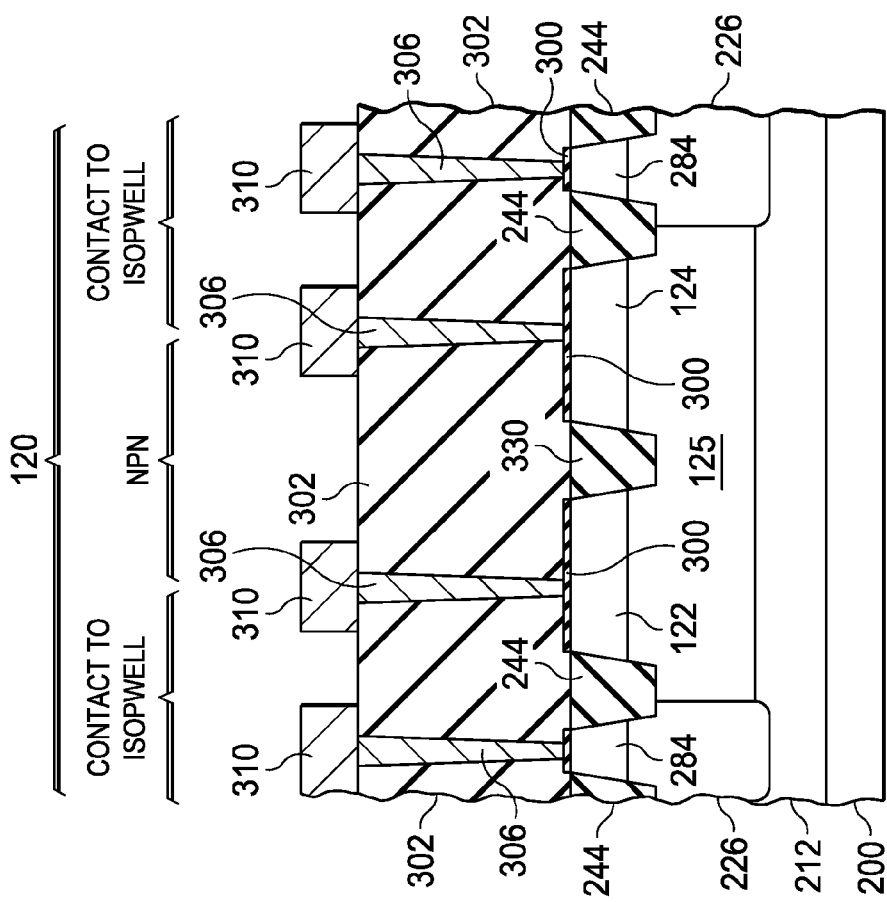

A cross sectional view of the embodiment base floating bidirectional ESD bipolar transistor 120 (FIG. 2B) is shown in FIG. 6A. In FIG. 6A a dielectric silicide blocking layer 292 prevents silicide 300 from shorting the emitter and collector diffusions, 122 and 124, to the base 125.

Alternatively, as shown in FIG. 6B a polysilicon gate geometry 320 with dielectric sidewalls 324 may be utilized to block silicidation 300 that otherwise would short the emitter and collector diffusions, 122 and 124, to the base 125.

Another option, illustrated in 6C, utilizes shallow trench isolation (STI) 330 to prevent silicide 300 from shorting the emitter and collector diffusions, 122 and 124, to the base 125.

Figure 1A:
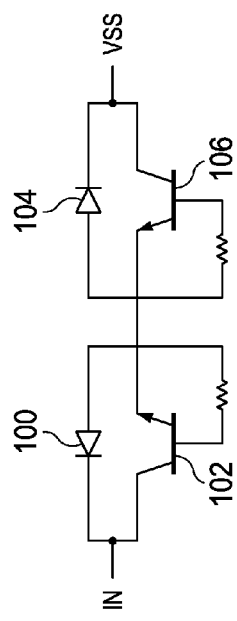
FIGS. 1A and 1B (Prior art) is a circuit diagram and a layout of a conventional ESD circuit protection device.
Figure 1B:
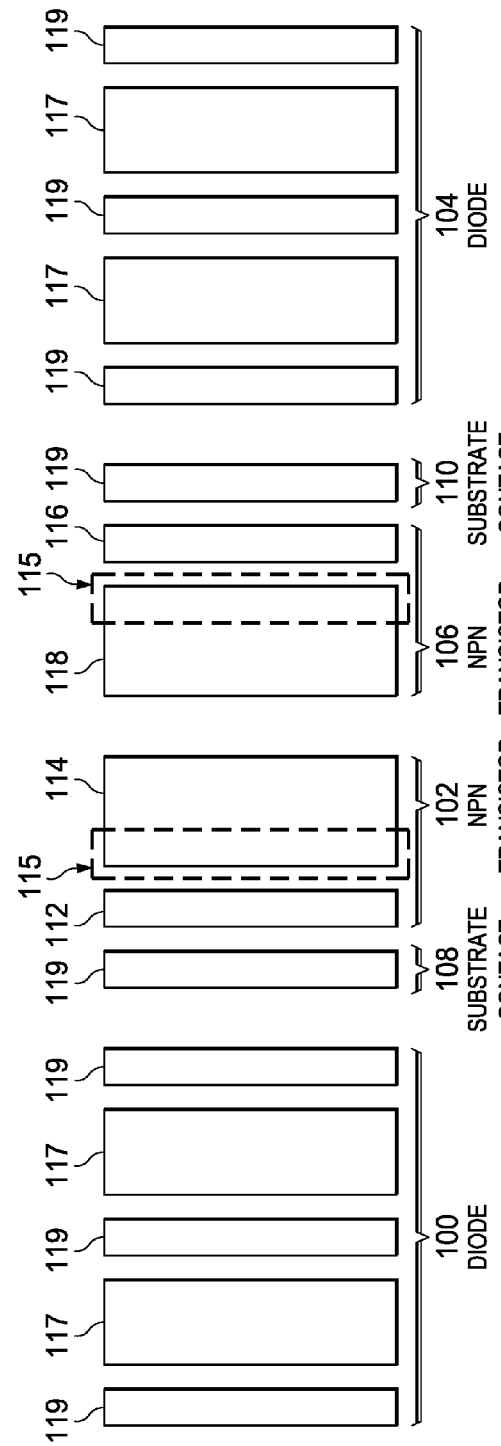

The embodiment ESD transistor 120 (FIGS. 2A and 2B) is a symmetric NPN bipolar transistor that operates in a bidirectional manner. For example, when a negative ESD pulse strikes IN, N+ diffusion 122 is the emitter and N+ diffusion 124 is the collector of the embodiment ESD transistor whereas when a positive ESD pulse strikes IN, N+ diffusion 122 is the collector and N+ diffusion 124 is the emitter of the embodiment bidirectional NPN ESD transistor. Since the embodiment NPN ESD transistor operates bidirectionally only one ESD NPN transistor is needed saving significant area. In addition, the ESD diodes, 100 and 104, that are required in a conventional device (see FIG. 1B) may be omitted. Omitting the ESD diodes, 100 and 104, significantly reduces area. It also eliminates the diode clamp voltage providing additional ESD protection. During an ESD strike with the embodiment bidirectional ESD transistor the ESD voltage rises to $V_{clamp\_NPN}$. In a conventional ESD protection circuit in FIG. 1 the ESD voltage rises to $V_{clamp\_NPN}+V_{clamp\_diode}$. The additional rise voltage caused by the diode clamp voltage may be sufficient to damage the IC.

Figure 3A:
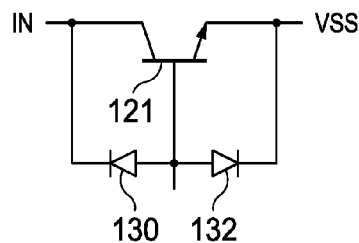
FIGS. 3A and 3B are a circuit diagram and a layout of an embodiment ESD circuit protection device formed according to principles of the invention.
Figure 3B:
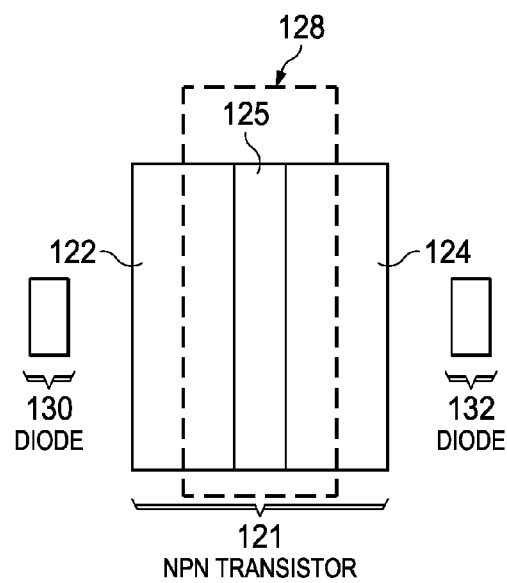

The circuit diagram and layout of an embodiment base biased bidirectional ESD circuit 121 with improved performance and reduced area is illustrated in FIGS. 3A and 3B. The transistor circuit diagram is shown in FIG. 3A and the layout is shown in FIG. 3B.

As shown in FIGS. 3A and 3B, base biasing diodes 130 and 132 are added between the base 125 and emitter, 122 or 124, and between the base 125 and collector, 122 or 124, of the embodiment base biased bidirectional NPN ESD transistor. The base biasing diodes 130 and 132 prevent the base from floating. The size of the base biasing diodes 130 and 132 may be adjusted to provide a desired base biasing. The size of the base biasing diodes, 130 and 132, is much smaller than the ESD diodes, 100 and 104, (FIG. 1B) and may be formed in the same isolated pwell as the embodiment base biased bidirectional NPN ESD transistor.

Figure 5:
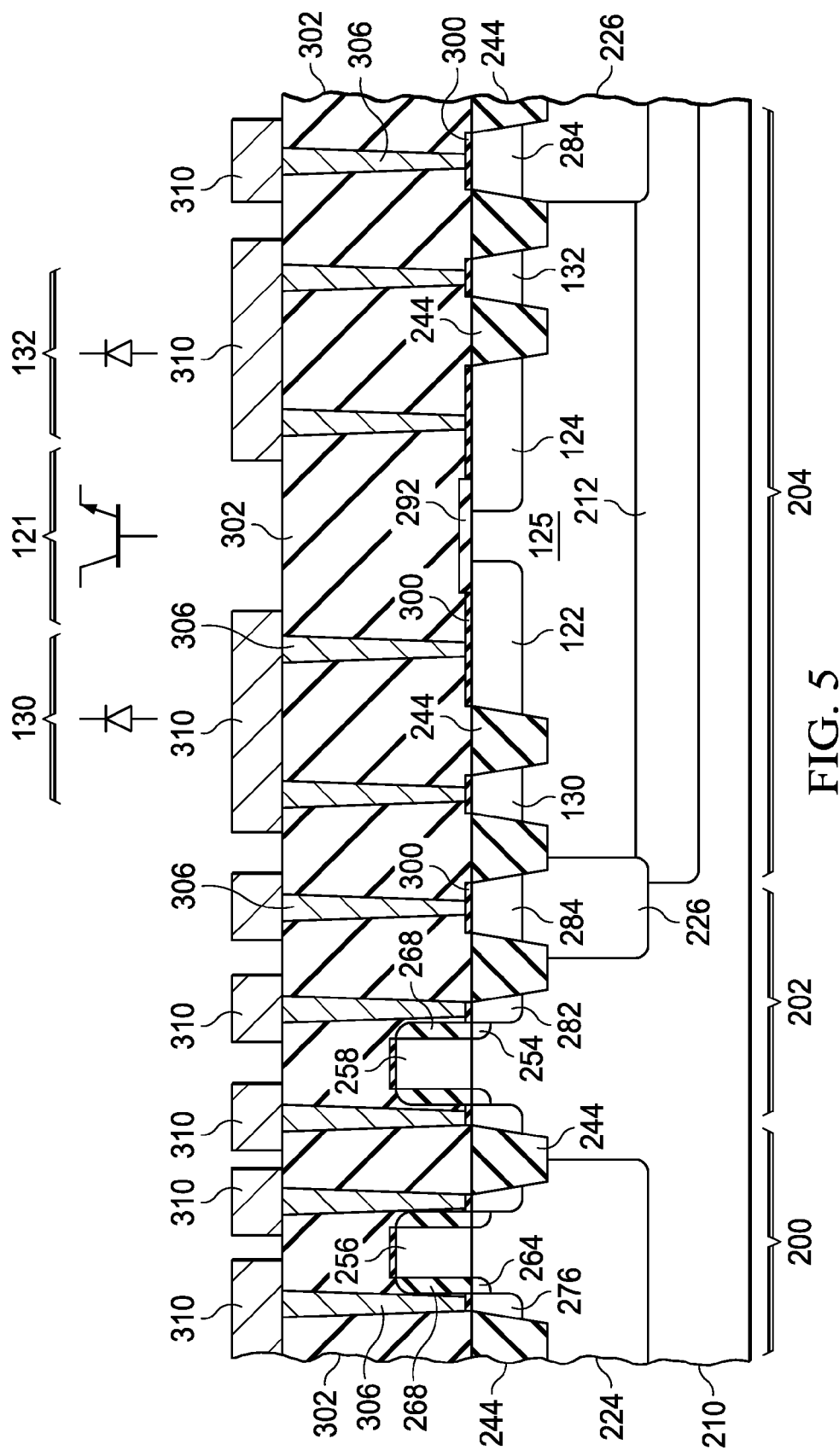
FIG. 5 is a cross sectional view of an embodiment ESD circuit protection device formed according to principles of the invention.

A cross sectional view of the embodiment base biased bidirectional NPN ESD transistor 121 of FIG. 3B is shown in FIG. 5. Base biasing diodes 130 and 132 are coupled between the base 125 and the emitter and collector diffusions, 122 and 124.

The major steps for forming an integrated circuit with an embodiment diode biased bidirectional ESD transistor are shown in the cross sections in FIGS. 4A through 4K. The embodiments are illustrated in a manufacturing flow that builds NMOS and PMOS transistors while building an embodiment bidirectional NPN ESD transistor. The embodiment bidirectional NPN ESD transistor may also be built as a standalone ESD protection device. When the embodiment base biased bidirectional NPN ESD transistor is built as a standalone device, the extra processing steps needed to form the CMOS transistors may be omitted saving significant cost.

Figure 4A:
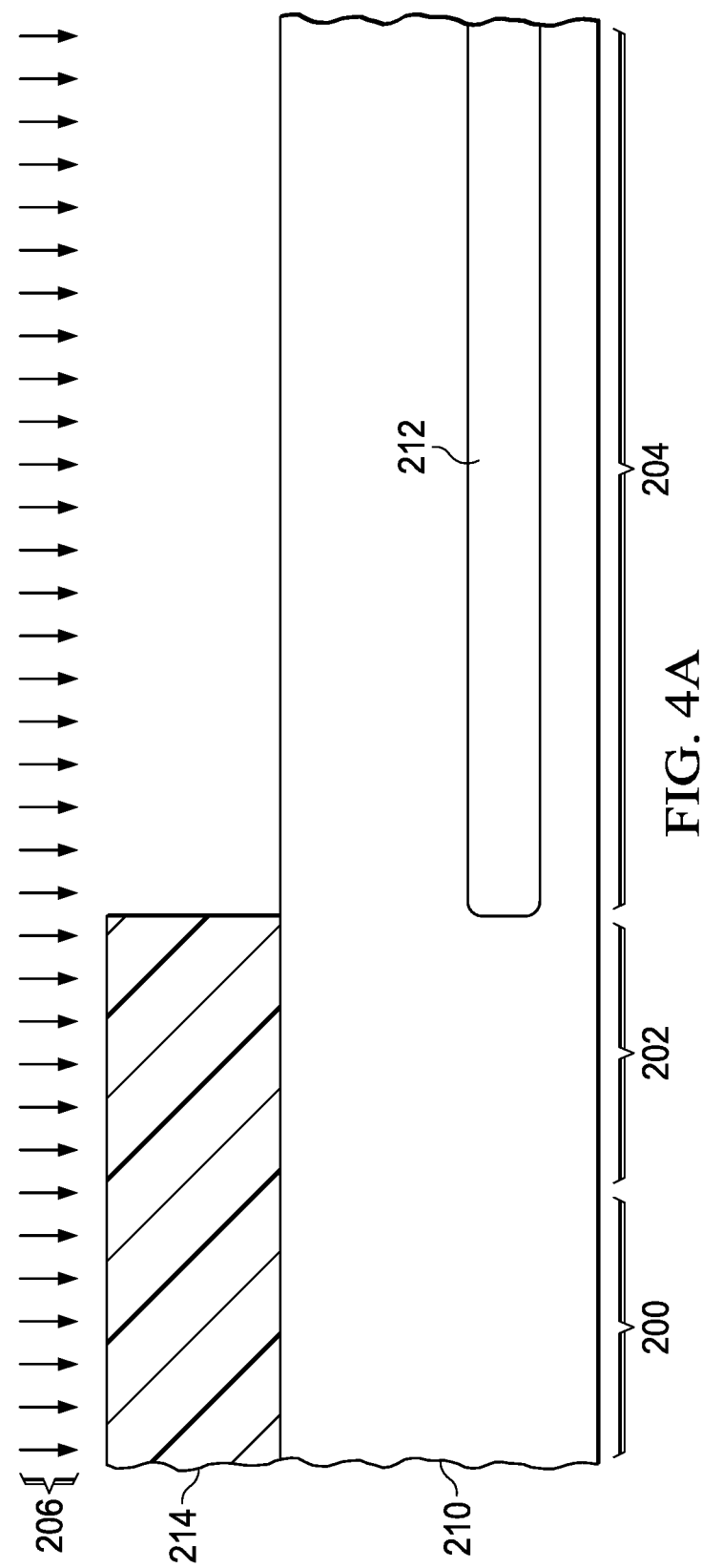

In FIG. 4A a deep NWELL photo resist pattern 214 is formed on a p-type substrate 210. N-type dopant 206 such as phosphorus in implanted at high energy to form deep nwell 212. The example process flow builds a PMOS transistor 200, an NMOS transistor 202, and an embodiment base biased bidirectional NPN ESD transistor 204.

Figure 4B:
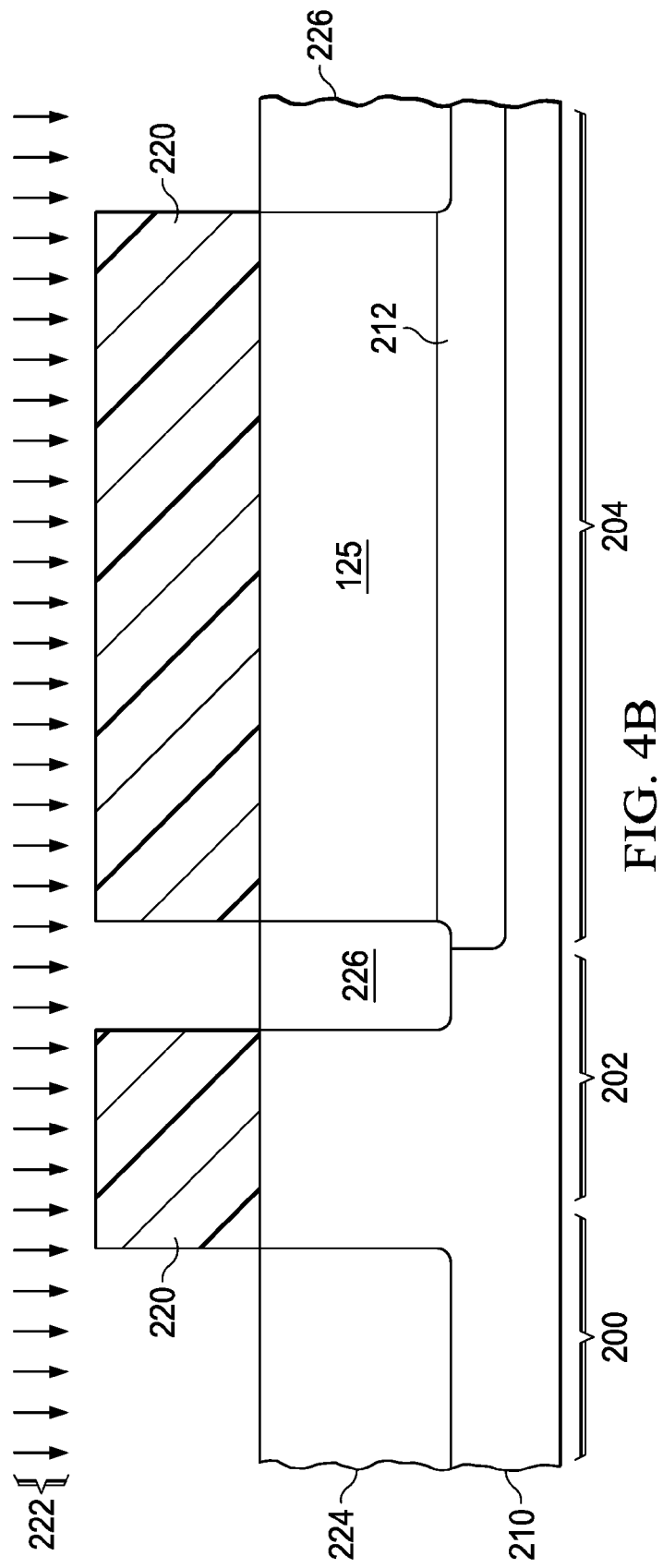

In FIG. 4B an nwell photo resist pattern 220 is formed on the substrate wafer 210 and an n-type dopant 222 such as phosphorus and arsenic is implanted to form an nwell 224 in which a PMOS transistor 200 is to be built and to form n-type diffusion 226 which provides electrical contact to the deep nwell 212. Nwell 226 encloses and electrically isolates the isolated pwell 125 from the p-type substrate 210. A high temperature well anneal may be used to activate the well dopants 202 and 222.

Figure 4C:
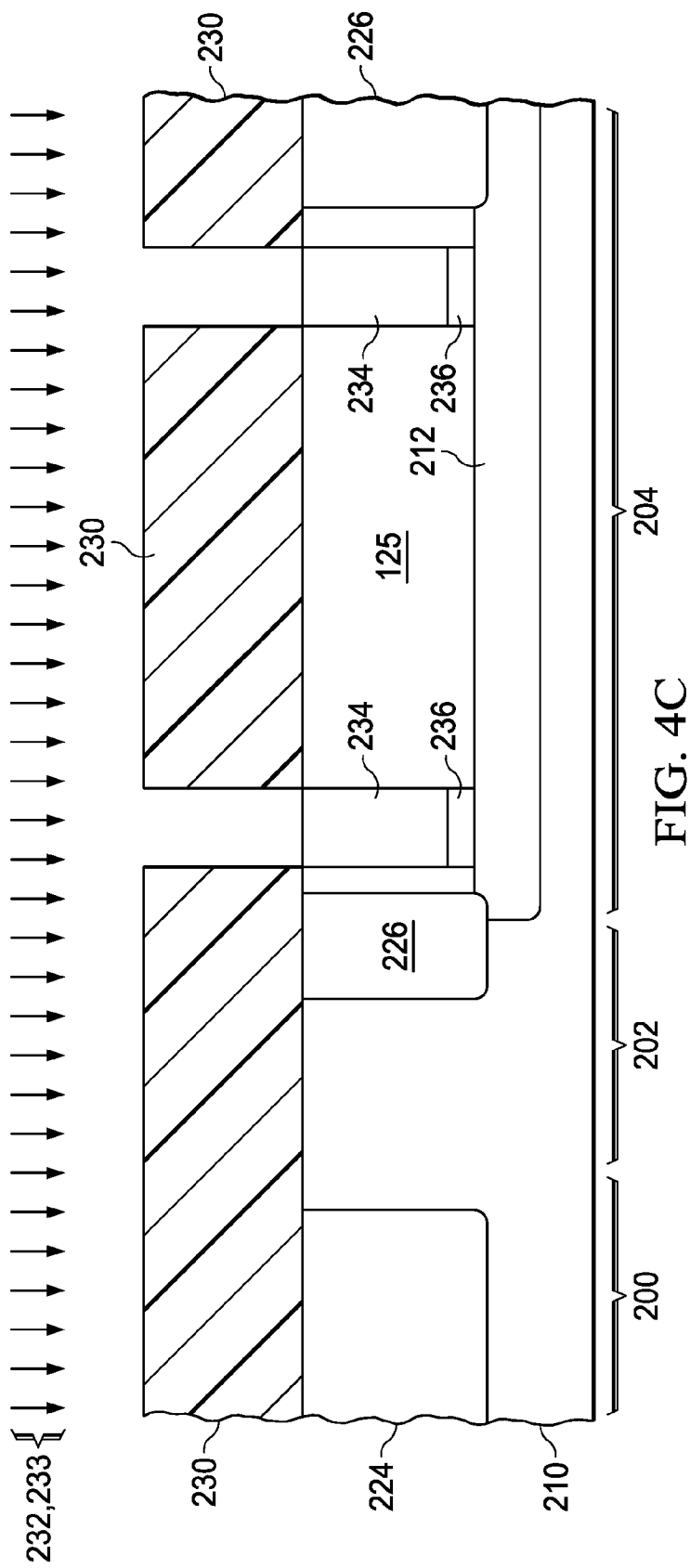

In FIG. 4C an optional deep base biasing diode photo resist pattern 230 is formed on the integrated circuit and an n-type dopant such as arsenic and phosphorus 232 is implanted to form a deep n-type base biasing diodes 234. A p-type implant 233 such as boron may also be implanted to form a p-type region 236 to prevent the deep n-type base biasing diodes 234 from shorting to the deep nwell diffusion 212. Addition of the optional deep n-type base biasing diode 234 provides improved base biasing. A less optimal n-type base biasing diode may be formed with no additional cost by omitting the deep n-type base biasing diode photo resist patterning 230 and implantation, 232 and 233, steps. The n-type base biasing diode is then formed using the NSD photo resist pattern and implant (see FIG. 5)

As shown in FIG. 4D shallow trench isolation (STI) geometries 244 are then formed in the usual manner to electrically isolate the transistors from each other and to electrically isolate the diodes.

Referring now to FIG. 4E, a transistor gate dielectric 246 is grown or deposited on the integrated circuit wafer and gate material 248 is deposited on the gate dielectric 246. A gate photo resist pattern 245 is formed on the gate material layer 248 with resist geometries to form transistor gates.

Figure 4F:
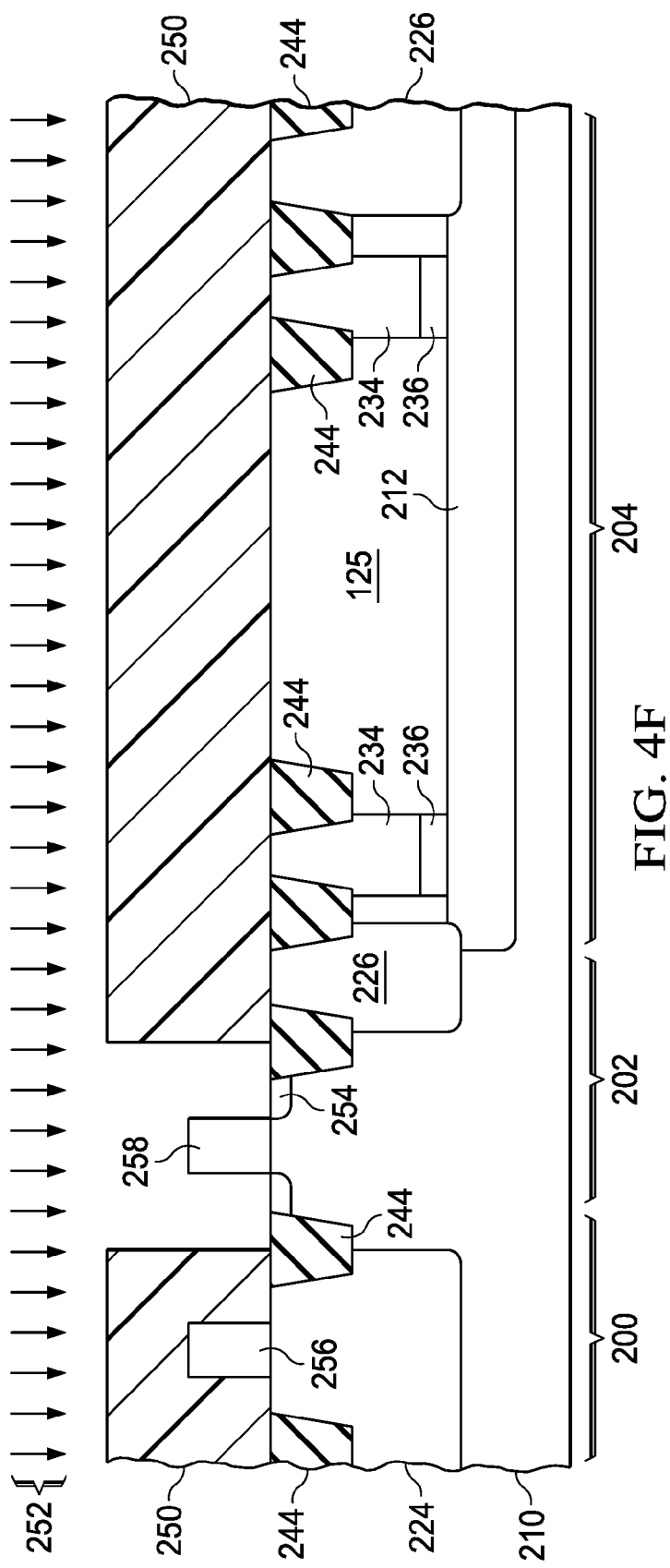

In FIG. 4F PMOS transistor gate, 256, and the NMOS transistor gate, 258, are etched and an NMOS source and drain extension photo resist pattern 250 is formed on the integrated circuit wafer. N-type dopants 252 such as phosphorus and arsenic are implanted to form source and drain extensions 254 self-aligned to the NMOS transistor gate 258.

Figure 4G:
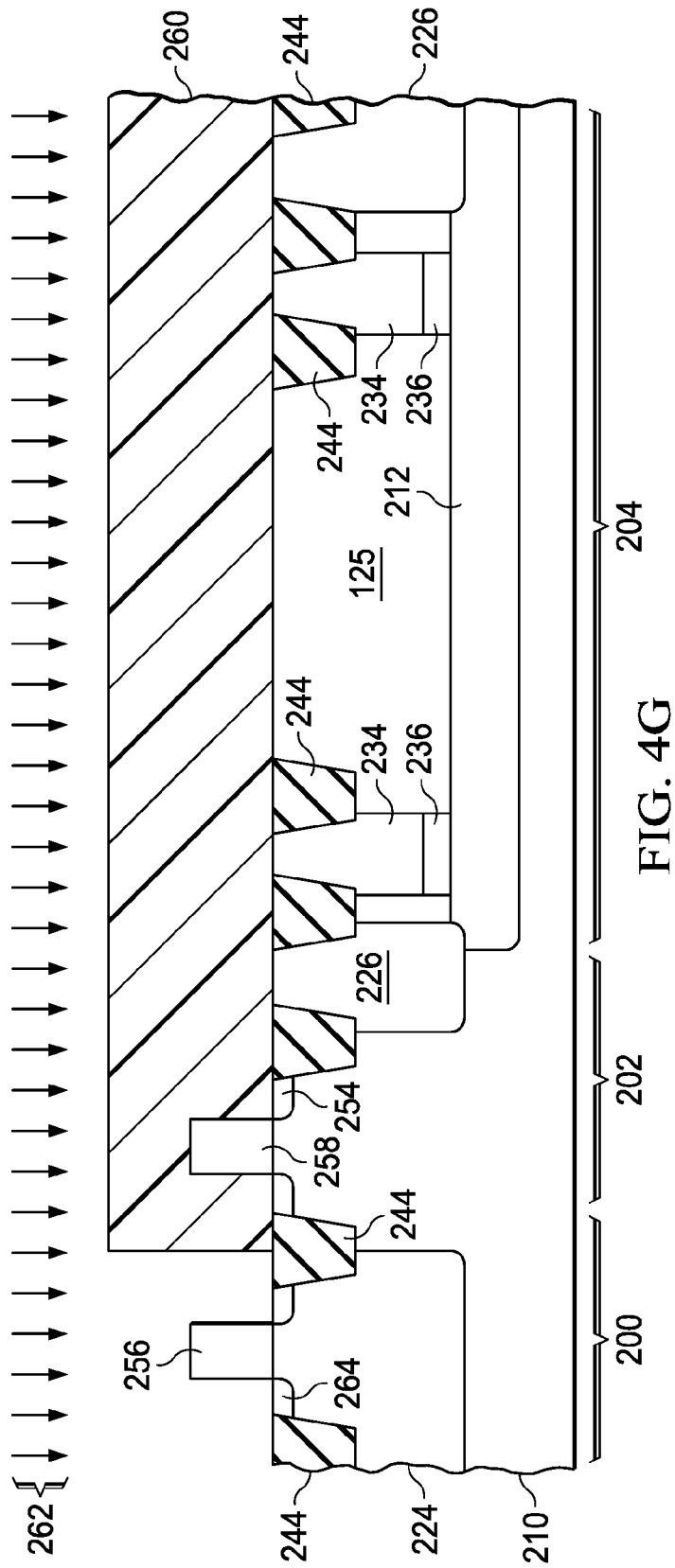

In FIG. 4G a PMOS source and drain extension photo resist pattern 260 is formed on the integrated circuit wafer and p-type dopants 262 such as boron and BF2 are implanted to form source and drain extensions 264 self-aligned to the PMOS transistor gate 256.

Figure 4H:
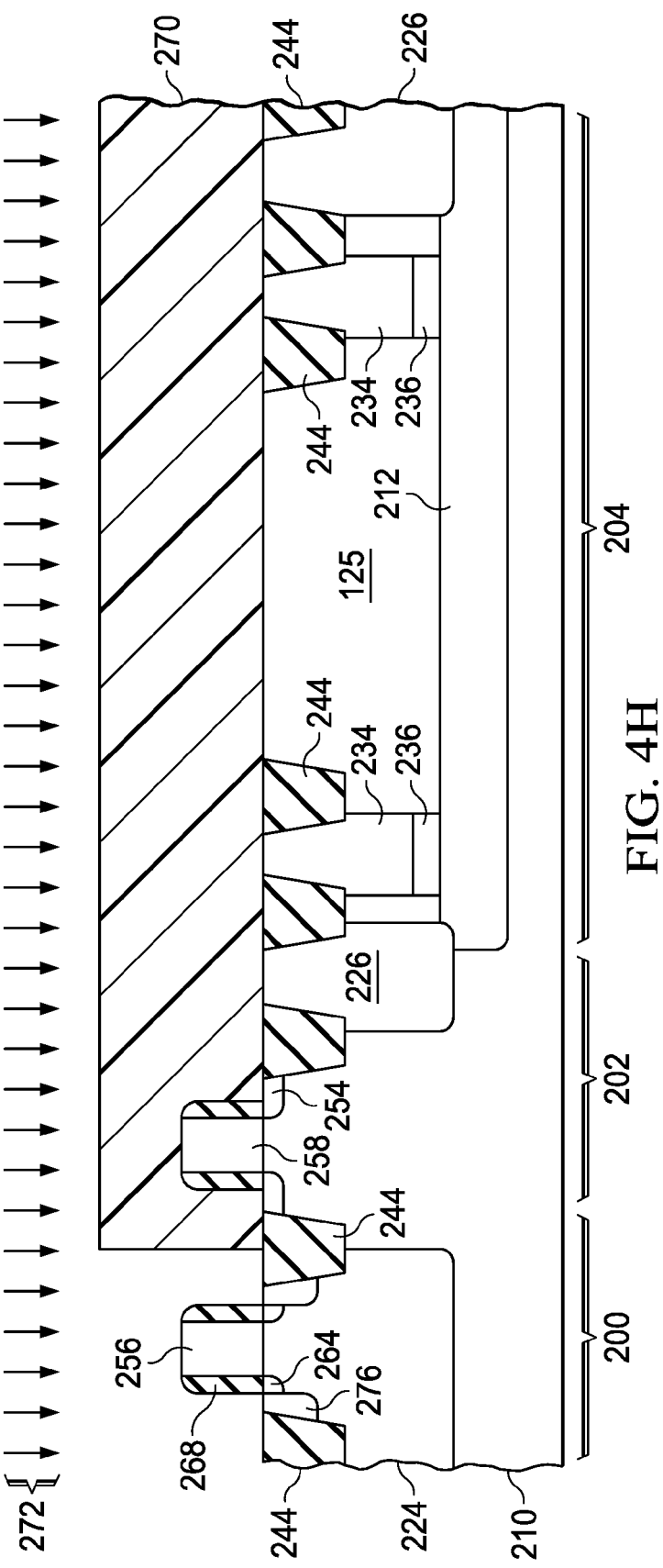

Dielectric sidewalls 268 are formed on the transistor gates, 256 and 258, and a PSD photo resist pattern 270 is formed on the integrated circuit wafer in FIG. 4H. P-type dopants 272 such as boron and $BF_2$ are implanted self-aligned to the dielectric sidewalls 268 on the PMOS transistor gate 256 to form deep PMOS transistor 200 source and drain diffusions 276.

Figure 4I:
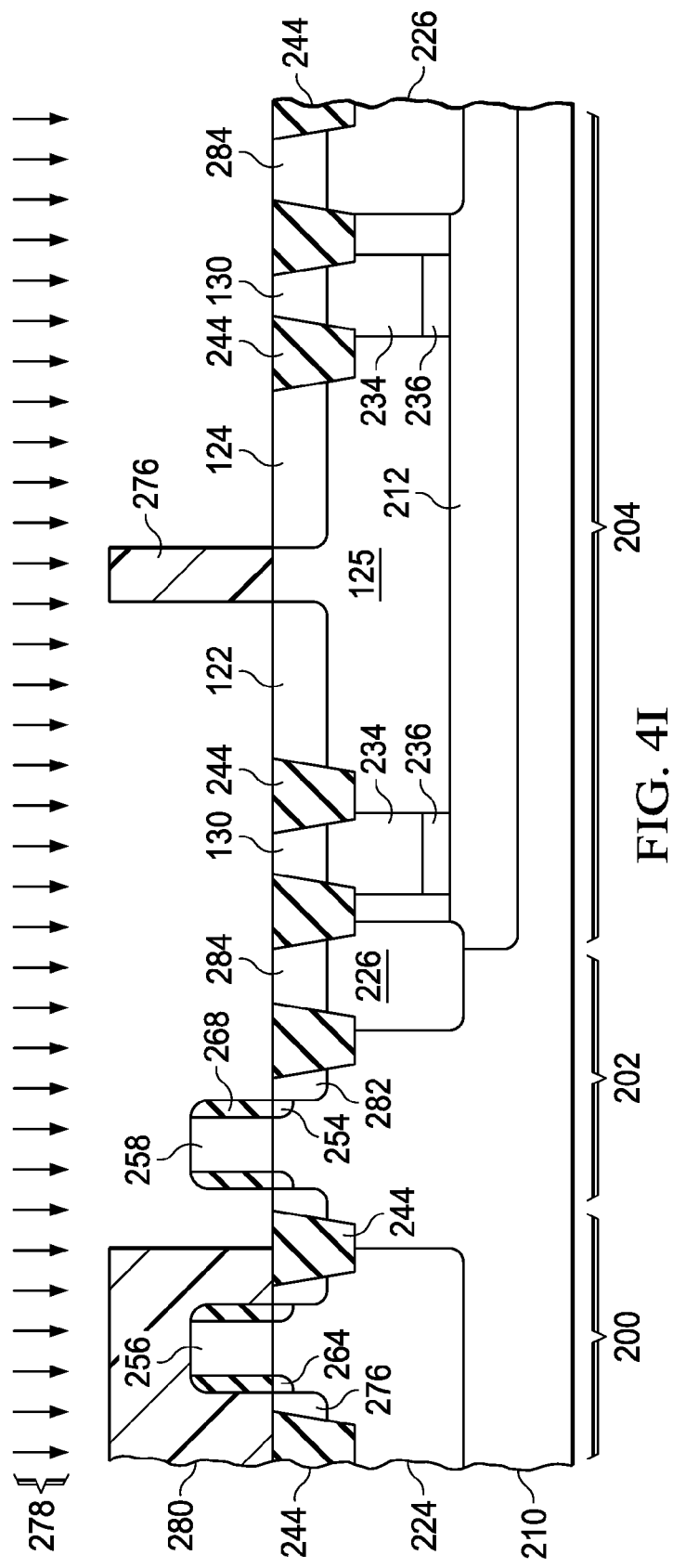

NSD photo resist pattern 280 is formed on the integrated circuit wafer in FIG. 4I. N-type dopants 278 such as phosphorus and arsenic are implanted self-aligned to the dielectric sidewalls 268 on the NMOS transistor gate 258 to form NMOS transistor 202 source and drain diffusions 282.

The n-type dopants 278 are also implanted into the embodiment base biased bidirectional ESD transistor 204 to form nwell contact diffusions 284, contact diffusions 130 to the deep base biasing diodes 234, and to form the symmetrical emitter and collector diffusions, 122 and 124. Resist geometry 276 blocks the n-type dopant 278 from the p-type base 125.

Figure 4J:
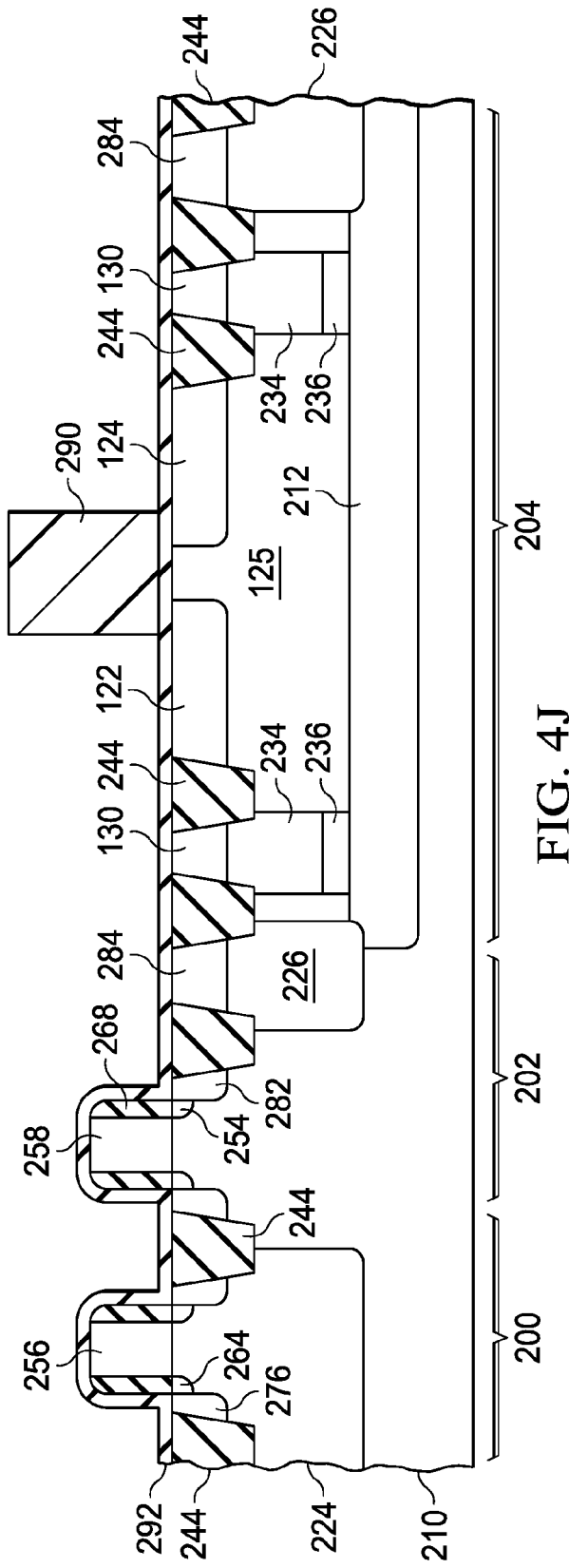

Referring now to FIG. 4J, a silicide block dielectric layer 292 is deposited on the wafer and a silicide block photo resist pattern 290 is formed on the silicide block dielectric layer 292. The silicide block photo resist pattern 290 prevents the removal of the silicide block dielectric from equal portions of the bidirectional emitter and collector diffusions, 122 and 124. The silicide block dielectric 292 also prevents silicide from shorting the pn-junctions formed between the emitter and collector, 122 and 124 diffusions and the base 125.

Figure 4K:
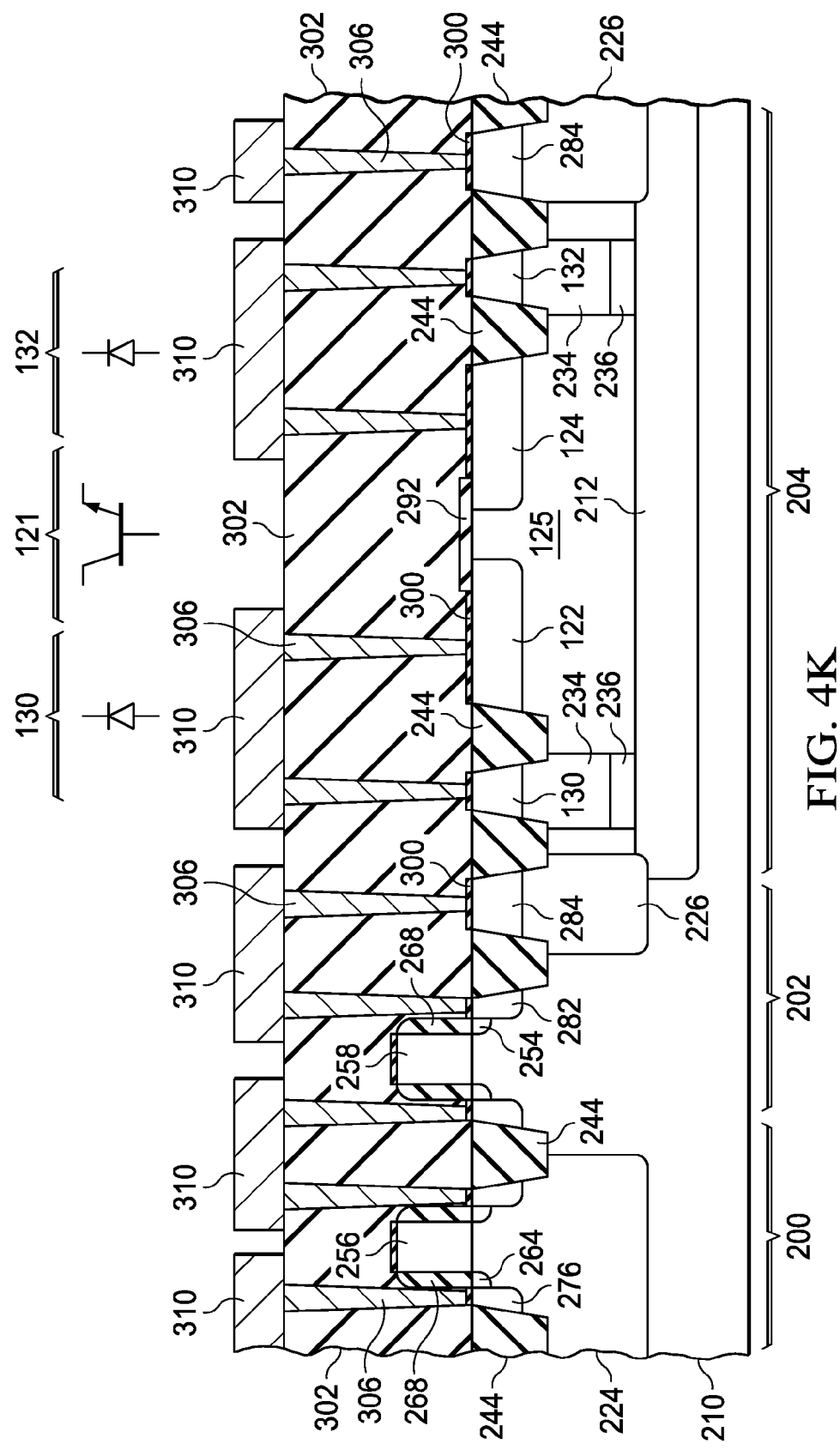

In FIG. 4K silicide 300 is formed on exposed single crystal silicon regions over diffusions and the exposed tops of polysilicon transistor gates, 256 and 258. Premetal dielectric (PMD) 302 is then deposited and planarized. The PMD layer may consist of several dielectric layers such as a contact etch stop dielectric layer, gap fill dielectric layer, and a PECVD doped or undoped silicon dioxide layer.

Contact plugs 306 are formed through the PMD layer 302 to electrically connect the transistor source and drain diffusions 276 and 282 to the first level of interconnect 310, and to electrically connect the embodiment base biased bidirectional NPN ESD transistor 204 nwell contact diffusions 284, base biasing diode diffusions 234, and the symmetrical emitter and collector diffusions 122 and 124 to the first level or interconnect 310.

Additional layers of dielectric and interconnect may be added to complete the integrated circuit.

A cross sectional view of the integrated circuit with the embodiment base biased bidirectional ESD device omitting the optional deep n-type base biasing diode photo resist patterning and implantation step is shown in FIG. 5. In this embodiment base biasing diodes are diffusions, 130 and 132 formed with NSD dopant 278.

An embodiment floating body bidirectional NPN ESD transistor with a isolated pwell 125 base that is electrically floating is illustrated in the cross section in FIG. 6A. Eliminating the base biasing diodes provides significant area savings and associated cost reduction.

The embodiment bidirectional NPN ESD transistors may also be manufactured and packaged as a stand-alone device. In this case the additional process steps required to form MOS transistors such PMOS transistor 200 and NMOS transistor 202 may be omitted from the manufacturing flow significantly reducing manufacturing cost.

Example process flow for building standalone base biased bidirectional NPN ESD transistors are shown in FIGS. 7A-7F. Three photo resist patterning steps (Iso-pwell, STI, and interconnect) are utilized to build the standalone base biased bidirectional NPN ESD transistor.

Figure 7A:
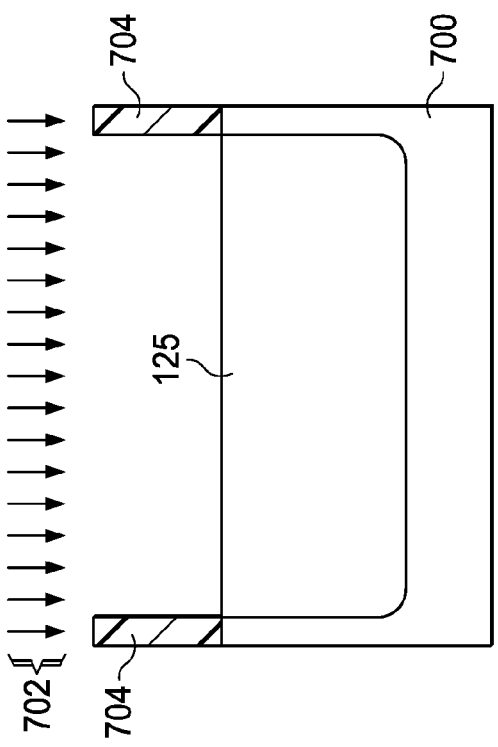
FIG. 7A-7F are illustrations of steps in the fabrication of integrated circuits formed according to principles of the invention.

In FIG. 7A, the manufacturing process starts with an n-type substrate 700. An isolated pwell photo resist pattern 704 is formed on the n-type substrate 700 and a p-type dopant 702 such as boron is implanted to form an isolated pwell 125.

Figure 7B:
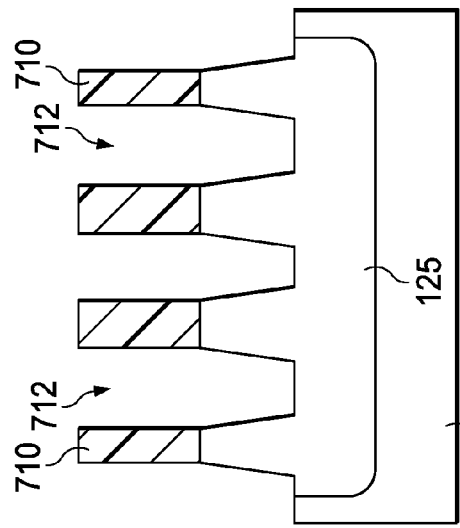

As shown in FIG. 7B a shallow trench isolation (STI) photo resist pattern 710 is formed on the substrate 700 and trenches 712 are etched into the substrate 700.

Figure 7C:
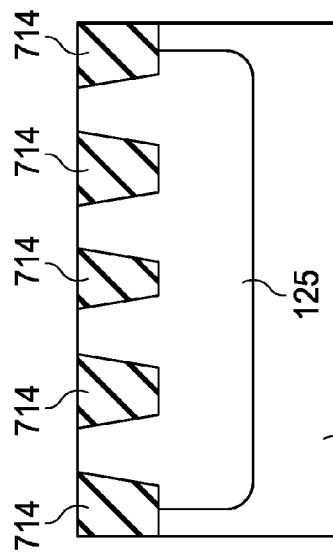

In FIG. 7C, the trenches 712 are filled with STI dielectric. The dielectric is planarized using CMP to form STI dielectric geometries 714.

Figure 7D:
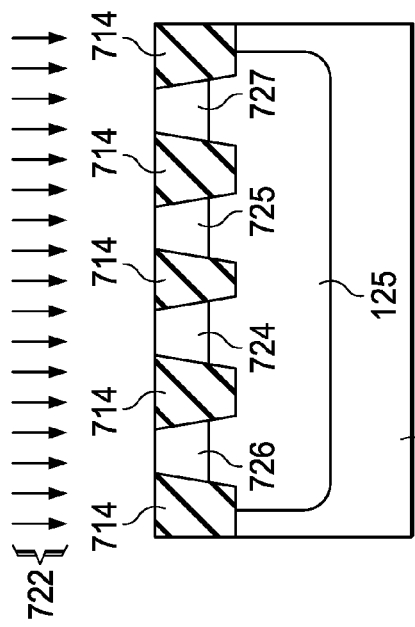

In FIG. 7D n-type dopant 722 is implanted using a blanket implant to form the bidirectional ESD NPN transistor emitter and collector diffusions 724 and 725 as well as base biasing diode diffusions 726 and 727.

Figure 7F:
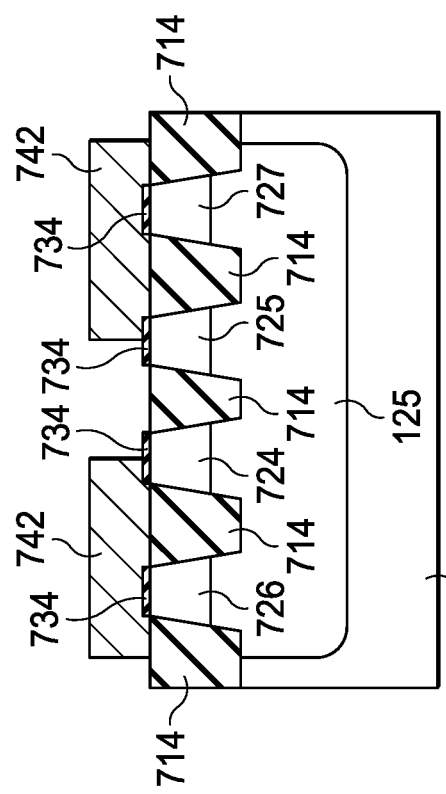
Figure 7E:
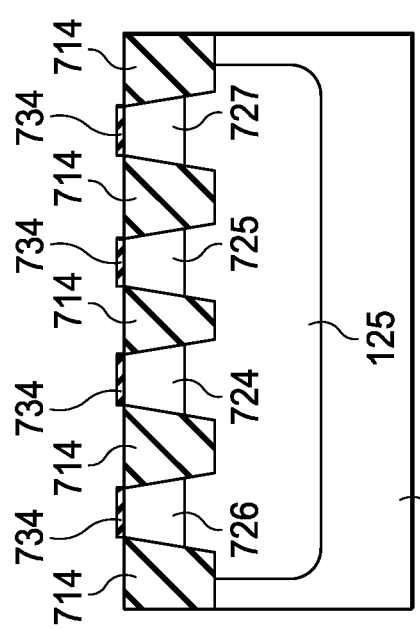

In FIG. 7E silicide 734 is then formed on the exposed emitter 724 and collector 725 diffusion regions and also on the surface of the base biasing diode diffusions 726 and 727.

FIG. 7F shows the bidirectional NPN ESD transistor after a layer of interconnect has been deposited, patterned, and etched to form interconnect geometries 742.

The embodiment standalone base biased bidirectional NPN ESD transistor in FIG. 7C uses backside contact to bias the substrate 700. If desired an additional active geometry may be added to the topside and an additional n-type pattern and implant may be added to provide topside contact to the substrate 700.

A standalone embodiment floating body NPN ESD transistor may be manufactured using the same process steps as for the embodiment body biased NPN ESD transistor illustrated in FIGS. 7A through 7F by eliminating the body biasing diodes 726 and 727. The area of the standalone embodiment floating body NPN ESD transistor is significantly smaller than the embodiment body biased NPN ESD transistor so more ESD devices may be formed on a wafer significantly reducing cost.

As is evident to those skilled in the art, bidirectional PNP ESD transistors and base biased bidirectional PNP ESD transistors may be formed with the same manufacturing steps by starting with a p-type substrate, forming an isolated n-well in the p-type substrate, and implanting p-type emitter and collector diffusions.

Those skilled in the art to which this invention relates will appreciate that many other embodiments and variations are possible within the scope of the claimed invention.

What is claimed is:

1. A process of forming a standalone bidirectional bipolar ESD transistor comprising the steps:
    providing a substrate wafer of a first doping type;
    forming a well photo resist pattern on the substrate;
    implanting well dopant of a second doping type to form a well;
    forming a shallow trench isolation (STI) pattern on the substrate;
    etching a STI trench over the boundary between the well and the substrate and etching a STI trench over a base of the bidirectional bipolar ESD transistor;
    forming dielectric STI geometries in the shallow trenches wherein a first STI geometry separates an emitter region from the boundary and wherein a second STI geometry separates a collector region from the boundary; and
    implanting dopant of the first dopant type into the emitter region to form an emitter diffusion and into the collector region to form a collector diffusion wherein the emitter diffusion and the collector diffusion are identical.

2. The process of claim 1 further comprising the steps:
    forming a first diode active area between the emitter region and the boundary of the well;
    forming a second diode active area between the collector region and the boundary of the well;
    implanting dopant of the first dopant type into the first diode active area to form a first base biasing diode;
    implanting dopant of the first dopant type into the second diode active area to form a second base biasing diode;
    coupling the first base biasing diode between the base and the emitter diffusion; and
    coupling the second base biasing diode between the base and the collector diffusion.

3. The process of claim 2 further including:
    forming a deep diode pattern on the substrate with a first opening over first diode active area and with a second opening over the second diode active area;
    implanting dopant of the first dopant type to form a first deep diode and to form a second deep diode wherein the first deep diode is disposed below and coupled to the first diode and wherein the second deep diode is disposed below and coupled to the second diode.

4. The process of claim 1, wherein the first doping type is n-type, the second doping type is p-type and the standalone bidirectional bipolar ESD transistor is a bidirectional NPN bipolar transistor.

5. A process of forming a bidirectional ESD device comprising:
    forming a well photo resist pattern on a substrate of a first doping type;
    implanting well dopant of a second doping type to form a well;
    forming a shallow trench isolation (STI) pattern on the substrate;
    etching a STI trench over a lateral boundary between the well and the substrate and etching a STI trench over a base of the bidirectional ESD device;
    forming dielectric STI geometries in the STI trenches wherein a first STI geometry separates an emitter region from the boundary and wherein a second STI geometry separates a collector region from the boundary; and
    simultaneously implanting dopant of the first dopant type into the emitter region to form an emitter diffusion and into the collector region to form a collector diffusion.

6. The process of claim 5, further comprising the steps:
    forming a first diode active area between the emitter region and the lateral boundary of the well;
    forming a second diode active area between the collector region and the lateral boundary of the well;
    implanting dopant of the first dopant type into the first diode active area to form a first base biasing diode;
    implanting dopant of the first dopant type into the second diode active area to form a second base biasing diode;
    coupling the first base biasing diode between the base and the emitter diffusion; and
    coupling the second base biasing diode between the base and the collector diffusion.

7. The process of claim 6, further including:
    forming a deep diode pattern on the substrate with a first opening over first diode active area and with a second opening over the second diode active area;
    implanting dopant of the first dopant type to form a first deep diode and to form a second deep diode wherein the first deep diode is disposed below and coupled to the first diode and wherein the second deep diode is disposed below and coupled to the second diode.

8. The process of claim 5, wherein the first doping type is n-type, the second doping type is p-type and the bidirectional ESD device is a bidirectional NPN bipolar transistor.

* * * * *